United States Patent [19]

Barrault et al.

[11] Patent Number: 5,083,081
[45] Date of Patent: Jan. 21, 1992

[54] CURRENT SENSOR FOR AN ELECTRONIC TRIP DEVICE

[75] Inventors: Michel Barrault, St. Ismier; Philippe Schuster, Grenoble; Roland Moussanet, Notre Dame de Commiers; Raymond Bresson, Grenoble, all of France

[73] Assignee: Merlin Gerin, Meylan, France

[21] Appl. No.: 658,771

[22] Filed: Feb. 21, 1991

[30] Foreign Application Priority Data

Mar. 1, 1990 [FR] France ................... 90 02703

[51] Int. Cl.⁵ .................... G01R 15/04; H01C 7/00
[52] U.S. Cl. .................... 324/126; 324/105; 335/172; 338/49
[58] Field of Search ........... 324/126, 105, 127; 338/49, 210, 211, 212; 335/170, 172, 174; 361/424; 174/35 R

[56] References Cited

U.S. PATENT DOCUMENTS

| | | | |
|---|---|---|---|
| 2,640,092 | 5/1953 | Fett et al. | 338/49 |
| 2,945,180 | 7/1960 | Parker | 324/126 |
| 3,112,444 | 11/1963 | Parker | 338/49 |
| 4,374,359 | 2/1983 | Missout | 324/126 |
| 4,629,979 | 12/1986 | Missout et al. | 361/424 |
| 4,710,738 | 12/1987 | Neel et al. | 335/172 |

FOREIGN PATENT DOCUMENTS

| | | |
|---|---|---|
| 0184609 | 6/1986 | European Pat. Off. . |
| 3724116 | 2/1988 | Fed. Rep. of Germany . |
| 2568684 | 2/1986 | France . |
| 2056182 | 3/1981 | United Kingdom . |

Primary Examiner—Ernest F. Karlsen
Attorney, Agent, or Firm—Parkhurst, Wendel & Rossi

[57] ABSTRACT

A measuring sensor of an electronic trip device of a circuit breaker comprises a shunt in the form of a hollow cylinder inside which there is located an electronic processing unit, comprising an amplifier circuit and an input resistance in good thermal contact with the internal face of the cylinder.

4 Claims, 3 Drawing Sheets

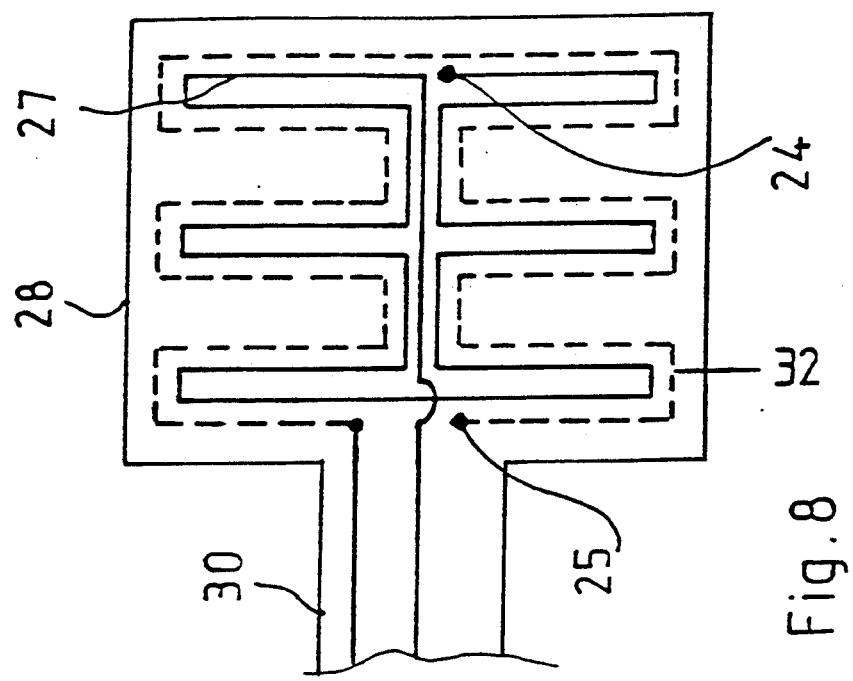
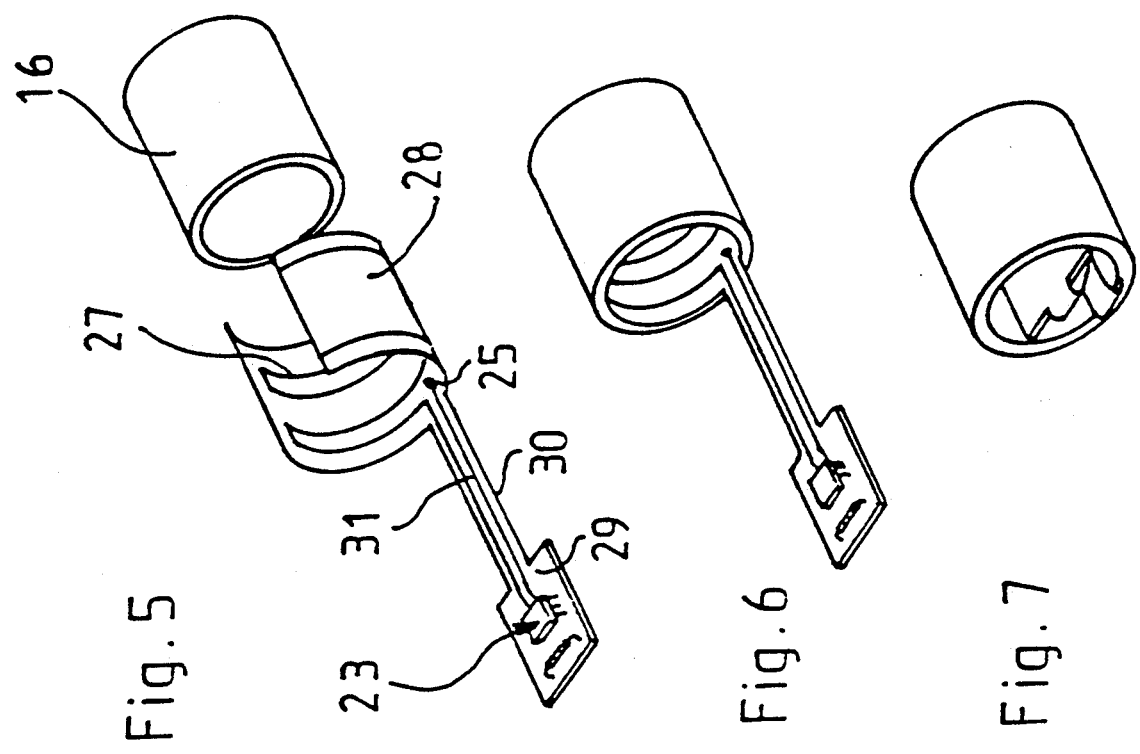

CURRENT SENSOR FOR AN ELECTRONIC TRIP DEVICE

BACKGROUND OF THE INVENTION

The invention relates to an alternating or direct current sensor for an electronic trip device of an electrical circuit breaker, comprising a tubular-shaped shunt through which said current flows axially and electrical measurement means to measure the potential difference produced at the terminals of said shunt by the current flow.

Electronic trip devices generally comprise current transformers delivering a signal proportional to the current flowing in the circuit breaker. Trip devices of this kind only operate in alternating current and with the development of direct current mains systems and appliances, the need has arisen for a universal current sensor, responding to alternating and direct currents and able to be fitted in circuit breakers, replacing the usual current transformers. It has already been proposed to use Hall effect sensors, but the latter are costly and unsuitable for an electrical circuit breaker environment.

It is known that a shunt resistance enables the current intensity to be calculated from the measurement of the potential difference at the terminals of the resistance through which this current flows. The resistance dissipates energy and this measurement principle is not applicable as such on power circuits, without taking special precautions.

The object of the present invention is to achieve a simple and accurate current sensor which can replace electronic trip device current transformers for measurement of alternating and direct currents.

SUMMARY OF THE INVENTION

The current sensor according to the invention is characterized in that said electronic means comprise an amplifier circuit having an input resistance made of the same material as said shunt, said input resistance being physically associated with said shunt so as to be subjected to the same temperature distribution as the shunt.

The power dissipated in the shunt must be low in order to avoid overheating and only a dissipation of a few watts, for example five watts, can be tolerated. This results in a very low shunt resistance value, for example a few microohms for currents of 10 0 amps and consequently in potential differences which are also very low, and which can be masked by disturbances, notably by shunt temperature variations. By making according to the invention the operational amplifier input resistance from the same material as the shunt and by ensuring the same temperature distribution in the shunt and in the input resistance, the temperature influences can be compensated and the current flowing in the shunt be measured accurately.

Good thermal contact is obtained by making the input resistance from a printed circuit on a flexible card, itself inserted inside the tubular shunt and lying flat against the whole internal surface of the shunt. The design of this resistance is optimized in order to minimize its inductance value. The linear arrangement of the input resistance in the axial direction of the shunt enables a temperature gradient along the shunt, due to temperature differences between the two ends, to be avoided.

Disturbances induced by the power circuits can be attenuated or cancelled out by locating the measurement signal processing unit in the immediate proximity of the measurement shunt and according to the invention it is located on a support inserted in the tubular shunt. The support in the form of a card is advantageously connected both mechanically and electrically to the input resistance support card by a flexible connection, which may or may not form a single piece with the cards. This arrangement also limits the influence of the nearby phases. The accuracy of the measuring channel can be increased by providing two input resistances, each connected to one of the amplifier inputs, the two resistances being identical and made of the same material as the shunt. The electromotive forces resulting from the thermocouples at the electrical junctions are thus compensated. By overlapping the circuits which form the two input resistances on the cards, and by forming half-turns through which currents of opposite direction flow, the currents induced notably by the nearby phases are also compensated. The assembly is compact and can be housed in the current transformer housing inside the circuit breaker cases. Tests have confirmed the measuring precision of a 100 Amp current to within 3%, the shunt being made of copper.

BRIEF DESCRIPTION OF THE DRAWINGS

Other advantages and features will become more clearly apparent from the following description of an illustrative embodiment of the invention, given as a non-restrictive example only and represented as the accompanying drawings, in which:

FIGS. 5, 6 and 7 are schematic perspective views of the shunt, input resistance and processing unit during the different insertion phases in the shunt;

FIG. 8 is a folded-out view of two input resistances.

DESCRIPTION OF THE PREFERRED EMBODIMENT

Figure 1:
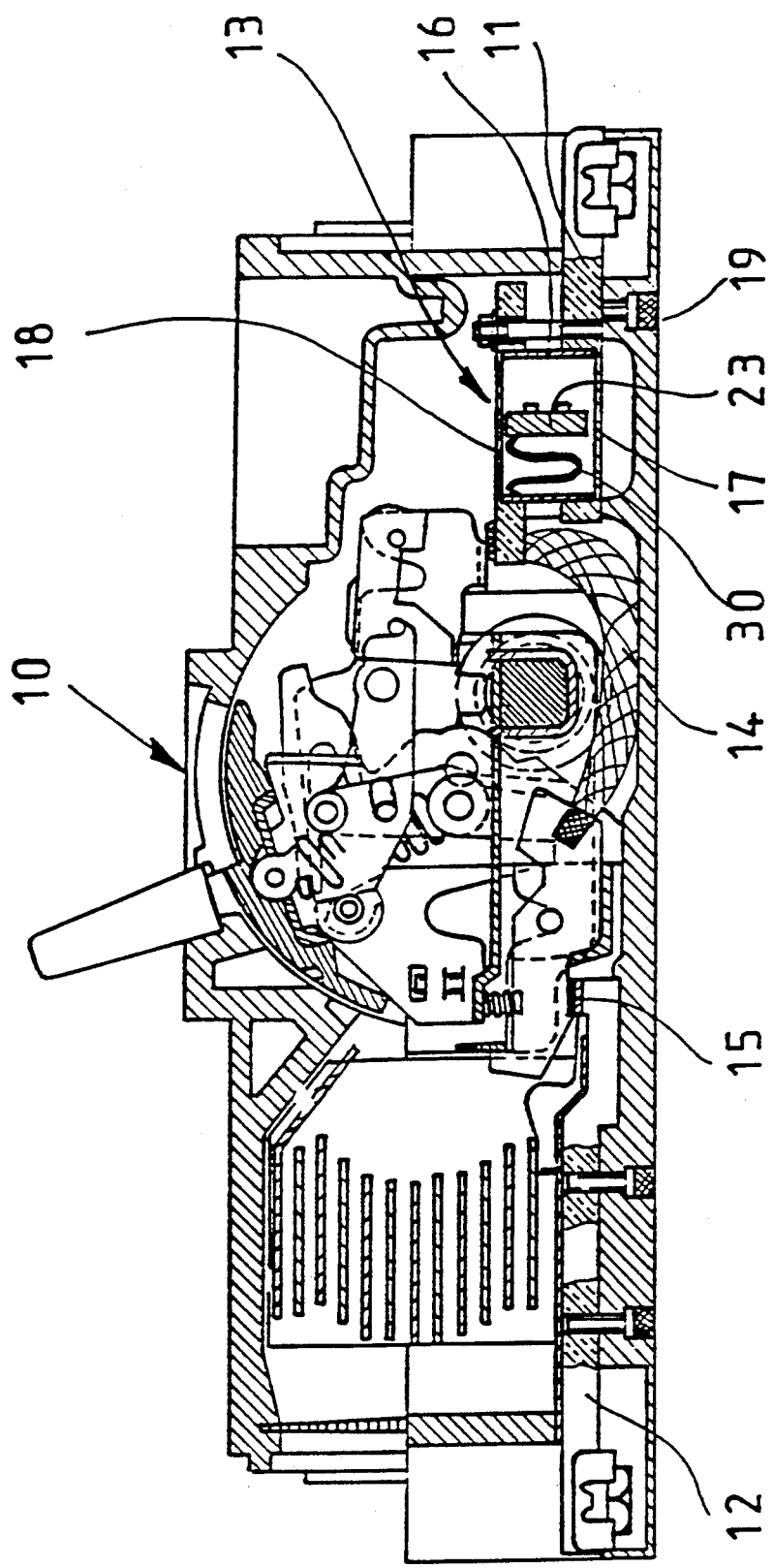
FIG. 1 is a schematic cross-sectional view of a circuit breaker equipped with a current sensor according to the invention.
Figure 2:
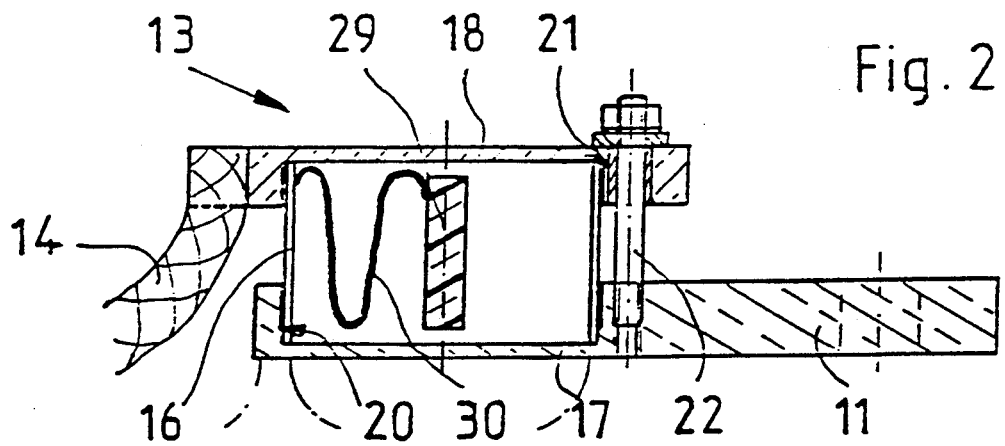
FIG. 2 is an enlarged scale view of the sensor in FIG. 1.
Figure 3:
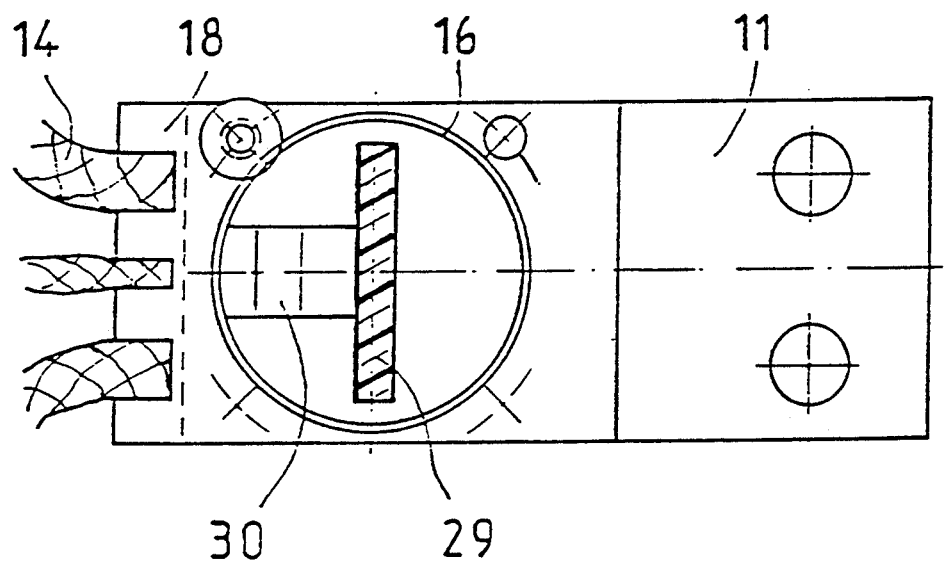
FIG. 3 is a bottom view of the sensor according to FIG. 2.

In FIG. 1 a molded case circuit breaker 10 comprises input and output terminal pads 11, 12 between which a current sensor 13, a braided strip 14 and a pair of contacts 15 are connected in series. The current sensor 13 delivers a signal proportional to the current flowing in the circuit breaker 10 to bring about a trip when this current exceeds a preset threshold. A circuit breaker of this kind is described in U.S. Pat. No. 4,710,738, which should be referred to for further details.

The sensor 13 is formed by a hollow cylinder 16 inserted between two plates 17, 18, one 17 of which near the base 19 of the case is an extension of the input terminal pad 11 and the opposite one 18 of which extends in the direction of the braided strip 14 which is affixed to it. The axis of the cylinder 16 is perpendicular to the base 19 and to the two plates 17, 18 and the ends of the cylinder 16 are slotted into conjugate hollow housings 20, 21 hollowed out from the thickness of the plates 17, 18, the assembly being held and secured by one or more insulating screws 22 which connect the two plates 17, 18. The current input at a given time via the terminal pad 11 flows axially through the hollow cylinder 16, the braided strip 14, and the pair of contacts 15, before being output via the terminal pad 12. The cylinder 16 is made of copper and its dimensions are chosen to present a resistance of a few microhms, for example 5 microhms. The power dissipated when the current flows through this resistance is therefore low and thus prevents overheating.

Figure 4:
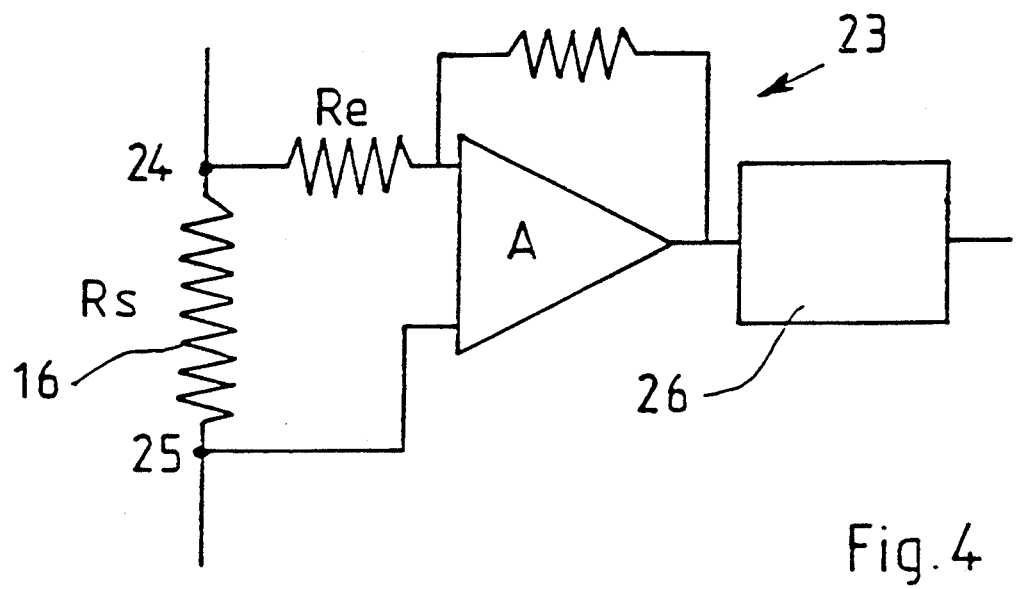
FIG. 4 shows the wiring diagram.

At the ends or terminals of the shunt resistance, formed by the hollow cylinder 16, a potential difference occurs which is proportional to the current flowing through the cylinder 16 and this potential difference is measured by an electronic processing unit 23 of integrated technology, the general layout of which is represented in FIG. 4. The two inputs of an amplifier circuit A are connected to the terminals 24, 25 of the shunt resistance Rs, with an input resistance Re inserted in the connecting circuit from the terminal 24 to the associated input. The operational amplifier A delivers a signal representative of this potential difference at the terminals 24, 25, which signal is applied to a conversion and transmission unit 26.

Referring now to FIGS. 5 and 7, it can be seen that the input resistance Re is formed by a printed circuit 27 on a flexible rectangular card 28 which can be folded and slid inside the cylinder 16 to lie flat against the whole internal surface of the cylinder 16 in good thermal contact with the latter. The printed circuit 27, represented in the figures, is single-faced, but it can be double-faced insulated from the cylinder 16 and it is connected to the cylinder 16, in fact to the terminal 24, by welding, or by a conducting glue or film, or by any other means. The electronic processing unit 23 is supported by a rigid support 29, mechanically connected by a flexible tongue 30 to the flexible card 28 and this tongue 30 supports the two connecting conductors 31 between the shunt resistance Rs and the electronic processing unit 23. One of these conductors 31 is connected to the corresponding terminal 25 or end of the cylinder 16, whereas the other one is connected to the resistance Re, formed by the printed circuit 27, connected to the opposite terminal 24. By unfolding the support 28 and tongue 30 the measuring electronic circuitry 23, 27 associated with the shunt 16 can easily be achieved and this electronic circuitry is then inserted into the hollow cylinder 16, the support 29 being slid inside the flexible card folded into a cylinder, itself sl ' into the cylinder 16. The flexibility of the card 28 and tongue 30 enables this embodiment, but it is clear that the invention is in no way limited to this particular embodiment.

The printed circuit 27 is arranged linearly along the whole cylinder 16 and is subjected to the same temperature distribution as this cylinder. By making the input resistance Re, i.e. the printed circuit 27, from the same material as the shunt resistance Rs, a temperature compensation is obtained and due to the regular distribution over the whole surface of the cylinder 16 any temperature gradient along this cylinder is also avoided.

The signal processing unit 23 is located close to the measuring place and inside the cylinder 16, which forms a shield, which limits the risks of disturbances by power currents, notably from the nearby circuit breaker phases.

The voltages measured are a few microvolts, that is to say in the order of magnitude of the thermoelectric electromotive forces generated at the junctions, to which particular care must be paid. The precision can be increased by making the two inputs of the processing unit 23 symmetrical by adding a second input resistance Re in good thermal contact with the cylinder 16.

FIG. 8 schematically represents a preferred embodiment of two printed circuits, one 27 represented by an unbroken line and the other 32 by a dotted line, forming the two input resistances Re. Circuit 27 is connected to terminal 24 and circuit 32 to terminal 25 and the two half-turn shaped circuits 27, 32 extend over the whole surface of the card 28 fitting together in such a way that two adjacent conductors of the two circuits 27, 32 are always in the opposite direction. A compensation is thus obtained which enhances measurement precision.

The sensor is small in size and can easily be housed in the current transformer housing.

The invention is in no way limited to the embodiment more particularly described, but can be extended to any variant which remains within the scope of equivalent embodiments notably to that wherein the shunt has a different cross-section or arrangement.

We claim:

1. An alternating or direct current sensor for an electronic trip device of an electrical circuit breaker, comprising :
    a flattened input conductor and a flattened output conductor,
    a measurement shunt in the form of a hollow cylinder fitted between the faces of said input and output conductors for said current to flow axially through it,
    electronic measuring means to measure the potential difference produced in the shunt by the current flow, said electronic means having an amplifier circuit and an amplifier circuit input resistance made of the same material as said shunt, said input resistance being a printed circuit card inserted in said cylinder and held in good thermal contact with the internal face of the cylinder, to be subjected to the same temperature distribution as the shunt.

2. The current sensor according to claim 1, wherein said card is made of flexible material and covers the whole internal surface of said cylinder, the input resistance being arranged linearly in the direction of the axis of the cylinder.

3. The current sensor according to claim 2, wherein said card comprises a flexible extension and a support of said amplifier circuit mechanically and electrically connected to the card by said extension, the amplifier and its support being inserted inside said cylinder with folding of said flexible extension.

4. The current sensor according to claim 1, wherein it comprises two input resistances respectively connected to the two inputs of said amplifier and symmetrically overlapping on said card in half-turns through which currents of opposite directions flow.

* * * * *